United States Patent
Kim et al.

(10) Patent No.: US 10,818,233 B2
(45) Date of Patent: Oct. 27, 2020

(54) SENSOR PACKAGE MODULE AND ORGANIC LIGHT-EMITTING DISPLAY HAVING SAME

(71) Applicant: LG Display Co., Ltd., Seoul (KR)

(72) Inventors: EunJung Kim, Seoul (KR); JongHee Hwang, Gyeonggi-do (KR); BuYeol Lee, Gyeonggi-do (KR); Sujin Kwon, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/532,586

(22) Filed: Aug. 6, 2019

(65) Prior Publication Data
US 2020/0105194 A1    Apr. 2, 2020

(30) Foreign Application Priority Data
Sep. 28, 2018 (KR) .......................... 10-2018-0115745

(51) Int. Cl.
*G09G 3/3241* (2016.01)
*H04N 7/14* (2006.01)
*H01L 27/32* (2006.01)

(52) U.S. Cl.
CPC .......... *G09G 3/3241* (2013.01); *H04N 7/144* (2013.01); *H01L 27/3234* (2013.01)

(58) Field of Classification Search
CPC .......................... G09G 3/3241; G09G 3/3258; H01L 27/3234; H04N 7/144; H04N 5/232; H04N 5/2254; H04M 1/72569; G01J 1/02; G01J 1/0422; G01J 1/32; G01S 17/48; G06F 3/044; G06F 21/83; G06F 1/1686; G06F 1/1688
See application file for complete search history.

(56) References Cited

U.S. PATENT DOCUMENTS

| | | | | |
|---|---|---|---|---|
| 2010/0127159 | A1* | 5/2010 | Watanabe | G01J 1/02 250/208.2 |
| 2010/0282953 | A1* | 11/2010 | Tam | G01J 1/32 250/226 |
| 2011/0057129 | A1* | 3/2011 | Yao | G01S 17/48 250/552 |
| 2012/0132788 | A1* | 5/2012 | Findlay | G01J 1/0422 250/208.2 |
| 2012/0258773 | A1* | 10/2012 | Alvarez Rivera | G06F 21/83 455/556.1 |
| 2013/0328842 | A1* | 12/2013 | Barnhoefer | G06F 3/044 345/207 |
| 2015/0187281 | A1* | 7/2015 | Lee | G09G 3/3258 345/212 |
| 2017/0084231 | A1* | 3/2017 | Chew | G06F 1/1686 |
| 2017/0123575 | A1* | 5/2017 | Evans, V | H04N 5/2254 |
| 2017/0193643 | A1* | 7/2017 | Naruse | H04N 5/232 |

(Continued)

*Primary Examiner* — Richard J Hong
(74) *Attorney, Agent, or Firm* — Polsinelli PC

(57) ABSTRACT

An organic light-emitting display device includes a display panel includes an active area in which a plurality of subpixels are arrayed, and a bezel area in which lines, through which a signal and a voltage to be supplied to the subpixels are transferred, are disposed, wherein each subpixels has a cathode and an anode; a data driver supplying a data signal to the subpixels; a gate driver supplying a data signal to the subpixels; a timing controller controlling the data driver and the gate driver; and a sensor package module having a portion that overlaps the active area.

18 Claims, 17 Drawing Sheets

(56) References Cited

U.S. PATENT DOCUMENTS

2018/0129328 A1\* 5/2018 Park .................... H01L 27/3234
2018/0260079 A1\* 9/2018 Zhang ............... H04M 1/72569
2019/0043452 A1\* 2/2019 Silvanto ................ G06F 1/1688

\* cited by examiner

SENSOR PACKAGE MODULE AND ORGANIC LIGHT-EMITTING DISPLAY HAVING SAME

CROSS REFERENCE TO RELATED APPLICATION

This application claims priority to Korean Patent Application No. 10-2018-0115745, filed on Sep. 28, 2018, which is hereby incorporated by reference in its entirety for all purposes as if fully set forth herein.

BACKGROUND

Field of the Disclosure

Exemplary aspects relate to a sensor package module and an organic light-emitting display having the same.

Description of the Background

With the development of the information society, demand for a variety of types of display devices for displaying images is increasing. In this regard, flat panel display devices, such as liquid crystal display (LCD) devices, and organic light-emitting diode (OLED) display devices, have come into widespread use.

Among flat panel display devices, organic light-emitting display devices have recently come into prominence, since they have superior properties, such as wide viewing angles, excellent contrast ratios, and the like, and can be provided with a thin profile. The organic light-emitting display devices can emit light to reproduce images by supplying a driving current to self-emissive organic light-emitting diodes.

The display devices include various sensors. In particular, the sensors receive light or emit light to perform proximity processing, or detect the intensity of external light to allow various programs to be executed.

A display device to which a narrow bezel that maximizes the display area while minimizing the non-display area as much as possible has been applied due to easiness in use and recent design trends has been widely developed.

However, since holes must be formed in the bezel area such that the sensors can receive or emit light, the application of the narrow bezel is limited due to the area occupied by the holes.

SUMMARY

The present disclosure provides a sensor package module for implementing a thin bezel and an organic light-emitting display device using the same.

The present disclosure also provides an organic light-emitting display device capable of preventing an increase in power consumption and deterioration in image quality.

According to an aspect, exemplary aspects may provide an organic light-emitting display device includes a display panel includes an active area in which a plurality of subpixels are arrayed, and a bezel area in which lines, through which a signal and a voltage to be supplied to the subpixels are transferred, are disposed, wherein each subpixels has a cathode and an anode; a data driver supplying a data signal to the subpixels; a gate driver supplying a data signal to the subpixels; a timing controller controlling the data driver and the gate driver; and a sensor package module having a portion that overlaps the active area.

According to another aspect, exemplary aspects may provide a sensor package module includes a camera module including an image sensing section that drives an image sensor, a lens driver that drives a lens to project light to the image sensor, and a camera controller that controls the image sensing section and the lens driver; and a proximity sensor including a light receiver that drives a light receiving sensor to sense light and a light emitter that drives a light-emitting device to emit light, wherein the camera controller controls the light receiver and the light emitter.

According to exemplary aspects, the sensor package module for implementing a thin bezel and the organic light-emitting display device using the same can be provided.

According to exemplary aspects, the organic light-emitting display device is capable of preventing an increase in power consumption and deterioration in image quality.

DESCRIPTION OF DRAWINGS

The above and other objects, features, and advantages of the present disclosure will be more clearly understood from the following detailed description when taken in conjunction with the accompanying drawings, in which.

DETAILED DESCRIPTION

Figure 1:
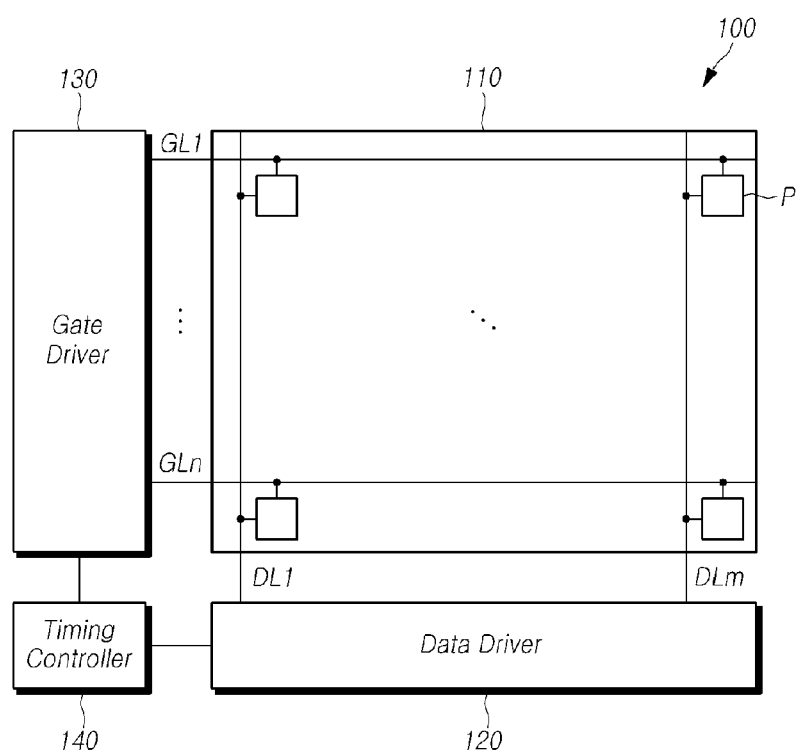
FIG. 1 is a schematic view illustrating a structure of an organic light-emitting display device according to the present disclosure.

Hereinafter, reference will be made to aspects of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated into the present disclosure will be omitted in the case that the subject matter of the present disclosure may be rendered unclear thereby.

It will also be understood that, while terms, such as "first," "second," "A," "B," "(a)," and "(b)," may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element. In the same context, it will be understood that when an element is referred to as being formed "on" or "under" another element, not only can it be directly located on or under the other element, but it can also be indirectly located on or under the other element via an intervening element.

FIG. 1 is a schematic view illustrating a structure of an organic light-emitting display (OLED) device according to an exemplary aspect.

Referring to FIG. 1, the OLED device 100 may include a display panel 110, a data driver 120, a gate driver 130, and a timing controller 140.

The display panel 110 may include a plurality of gate lines GL1 to GLn and a plurality of data lines DL1 to DLm which intersect with each other. The display panel 110 includes a plurality of subpixels P provided corresponding to an area in which the plurality of gate lines GL1, . . . , and GLn and the plurality of data lines DL1, . . . , and DLm intersect with each other. The plurality of subpixels P may include an organic light-emitting diode (not shown) and a pixel circuit (not shown) for supplying a driving current to the organic light-emitting diode. The pixel circuit may be connected to the gate lines GL1, . . . , and GLn and the data lines DL1, . . . , and DLm to supply a driving current to the organic light-emitting diodes. Here, lines disposed in the display panel 110 are not limited to the plurality of gate lines GL1, . . . , and GLn and the plurality of data lines DL1, . . . , and DLm.

The data driver 120 may apply a data signal to the plurality of data lines DL1, . . . , and DLm. The data signal may correspond to the gradation, and a voltage level of the data signal may be determined according to the corresponding gradation. The voltage of the data signal may be referred to as a data voltage.

Here, although the data driver 120 is illustrated as a single data driver, the present disclosure is not limited thereto. Two or more data drivers may be provided, depending on the size and resolution of the display panel 110. In addition, the data driver 120 may be implemented as an integrated circuit.

The gate driver 130 may apply a gate signal to the plurality of gate lines GL1, . . . , and GLn. The subpixel P corresponding to the plurality of gate lines GL1, . . . , and GLn to which the gate signal is applied can receive the data signal. In addition, the gate driver 130 may transfer a sensing signal to the subpixel P. The subpixel P, having received the sensing signal output from the gate driver 130, may receive a sensing voltage output from the data driver 120. Here, although the gate driver 130 is illustrated as a single gate driver, the present disclosure is not limited thereto. At least two gate drivers may be provided. The gate drivers 130 may be disposed on both sides of the display panel 110, respectively, such that one of the gate drivers 130 is connected to the odd-numbered gate lines among the plurality of gate lines GL1 to GLn, and the other of the gate drivers 130 may be connected to even-numbered gate lines among the plurality of gate lines GL1 to GLn. However, the present disclosure is not limited thereto. The gate driver 130 may be implemented as an integrated circuit.

The timing controller 140 may control the data driver 120 and the gate driver 130. In addition, the timing controller 140 may transfer image data, corresponding to the data signal, to the data driver 120. The image data may be a digital signal. The timing controller 140 may correct the image signal and transfer the corrected image signal to the data driver 120. The operation of the timing controller 140 is not limited thereto. The timing controller 140 may be implemented as an integrated circuit.

Figure 2:
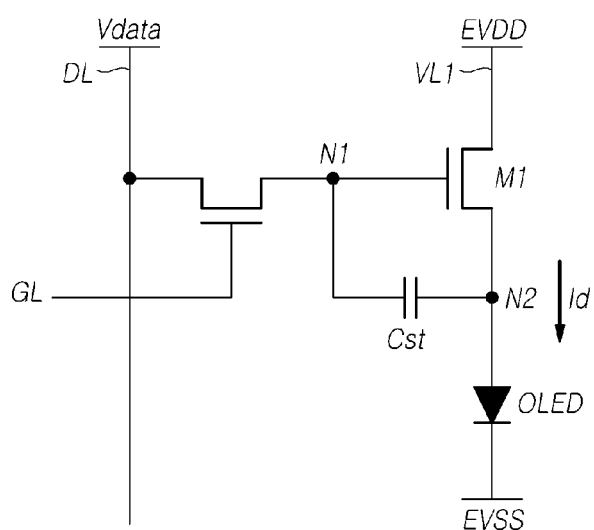
FIG. 2 is a circuit diagram illustrating an exemplary aspect of the subpixel illustrated in FIG. 1.

FIG. 2 is a circuit diagram illustrating an exemplary aspect of the subpixel illustrated in FIG. 1.

Referring to FIG. 2, the subpixel P may include an organic light-emitting diode (OLED) and a pixel circuit for driving the OLED. The pixel circuit may include a first transistor M1, a second transistor M2, and a capacitor Cs.

The first transistor M1 has a first electrode connected to a first power supply line VL1, through which a pixel high potential voltage EVDD is transferred, a gate electrode connected to a first node N1, and a second electrode connected to a second node N2. The first transistor M1 may cause a current to flow to the second node N1, in response to a voltage being transferred to the second node N2. The first electrode of the first transistor M1 may be a drain electrode and the second electrode may be a source electrode. However, the present disclosure is not limited thereto.

The current flowing to the second node N2 may correspond to the following Equation 1:

$$Id = k(V_{GS} - Vth)^2 \quad (1)$$

where Id denotes the amount of current flowing through the second node N2, k denotes electron mobility of the transistor, VGS denotes a voltage difference between the gate electrode and the source electrode of the first transistor M1, and Vth denotes a threshold voltage of the first transistor M1.

Therefore, since the amount of current varies depending on the deviation of the electron mobility and the threshold voltage, it is possible to prevent the deterioration of the image quality by correcting the data signal depending on the deviation of the electron mobility and the threshold voltage.

The second transistor M2 has a first electrode connected to the data line DL, a gate electrode connected to the gate line GL, and a second electrode connected to a first node N1. Thus, the second transistor M2 may cause a data voltage Vdata corresponding to the data signal to the first node N1, in response to a gate signal being transferred through the gate line GL. The first electrode of the second transistor M2 may be a drain electrode and the second electrode may be a source electrode. However, the present disclosure is not limited thereto.

The capacitor Cs may be connected between the first node N1 and the second node N2. The capacitor Cs may maintain the voltages of the gate electrode and the source electrode of the first transistor M1 constant.

The organic light-emitting diode OLED may have an anode connected to the second node N2 and a cathode connected to a pixel low potential voltage EVSS. Here, the pixel low potential voltage EVSS may be a ground voltage. However, the present disclosure is not limited thereto. When an electric current flows from the anode to the cathode, the organic light-emitting diode (OLED) may emit light depending on the amount of current. The organic light-emitting diode (OLED) may emit light of any one of red, green, blue, and white. However, the present disclosure is not limited thereto.

The circuit of the subpixel employed in the organic light-emitting display device 100 is not limited thereto.

Figure 3:
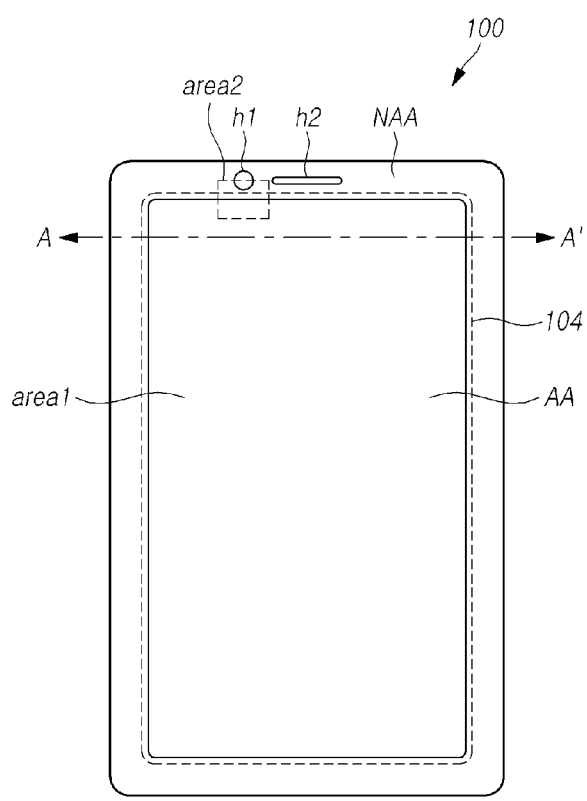
FIG. 3 is a plan view illustrating an exemplary aspect of an electronic device employing the organic light-emitting display device illustrated in FIG. 1.

FIG. 3 is a plan view illustrating an exemplary aspect of an electronic device employing the organic light-emitting display device illustrated in FIG. 1.

Referring to FIG. 3, the electronic device 300 may include an active area AA on which an image is displayed and a bezel area NAA in which lines for transferring signals and voltages to the active area AA are disposed. The active area AA may be an area in which the display panel 110 illustrated in FIG. 1 is exposed and a user can recognize the displayed image. Although the shape of the active area AA is illustrated as being rectangular, it is not limited thereto. A transparent material may be disposed on the active area AA. A touch electrode (not shown) may be disposed on the active area AA. The electronic device 300 may have a first hole h1 provided in the upper portion of the bezel area NAA. When the electronic device 300 includes a camera, a lens of the camera may be disposed in the first hole h1. In addition, a second hole h2 may be disposed in the bezel area NAA. In a case in which the electronic device 300 is a smart phone, the second hole h2 may be a hole holding a speaker for outputting a voice during a conversation. However, the hole disposed in the bezel area NAA is not limited thereto.

A cathode 104 may be disposed on the active area AA. The cathode 104 may correspond to a cathode of the organic light-emitting diode (OLED) illustrated in FIG. 2. The cathode 104 may be provided as a common electrode and may be disposed on the active area AA. Further, the electronic device 300 may have a sensor package module disposed in a location in which at least a portion of the electronic device 300 overlaps the active area AA.

The sensor package module may include a plurality of sensors. In addition, the sensor package module may include a light-emitting device. The sensor package module may serve to detect the proximity of an object and the intensity of external light by detecting infrared (IR) radiation and visible light, and may emit IR radiation. The sensor package module may be a proximity sensor. Therefore, the sensor package module can emit or receive light. When the sensor package module to emit light or receive light is disposed in the bezel area NAA, separate holes should be provided in the bezel area NAA to allow the sensor package module to emit light or receive light. If a hole is formed in the bezel area NAA, the area occupied by the hole is required for the bezel area NAA, which limits the width of the bezel area NAA. This may interfere with the implementation of a narrow bezel. However, if the holes required for the sensor package module are not disposed in the bezel area NAA, the number of holes provided in the bezel area NAA may be reduced so that the bezel area NAA of the electronic device 300 may be thinned accordingly. Here, narrowing the bezel area NAA may mean that the width of the bezel area NAA in the direction perpendicular to the sides of the electronic device is made thinner. However, the present disclosure is not limited thereto.

In a case in which the active area AA of the electronic device 300 is designed to allow a sufficient amount of light to pass there through, the sensor package module 150 can use the light that has passed through the active area AA. Therefore, when the active area AA of the electronic device 300 has a predetermined degree of transmittance, the sensor package module 150 may be disposed to overlap the active area AA. It is not necessary to form the holes, through which the sensor package module 150 is irradiated with light, in the bezel area NAA. This makes it easier to implement a narrow bezel.

The sensor package module may detect light from the active area AA. The sensor package module may emit IR radiation and receive reflected IR radiation from an object, or receive visible light contained in natural light.

An area, in the active area AA of the electronic device 300, not overlapping the sensor package module, may be referred to as a first area area1, while an area overlapping the sensor package module may be referred to as a second area area2. A portion of the second area area2 may overlap the active area AA. Also, the second area area2 may be an area corresponding to a specific part of the sensor package module on the active area AA. That is, only a part of the area overlapping the sensor package module may be the second area area2.

Figure 4:
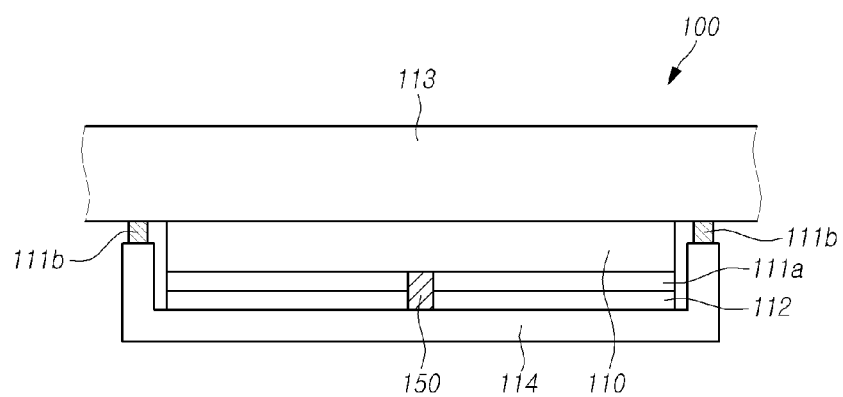
FIG. 4 is a cross-sectional view illustrating an exemplary cross-sectional structure taken along line A-A' of the electronic device illustrated in FIG. 3.

FIG. 4 is a cross-sectional view illustrating an exemplary cross-sectional structure taken along line A-A' of the electronic device illustrated in FIG. 3.

Referring to FIG. 4, the electronic device 300 may include a display panel 110 and a mid-frame 114 protecting the display panel 110. A first foam pad 111a and a heat sink 112 may be disposed between the display panel 110 and the mid-frame 114. However, the structures disposed between the display panel 110 and the mid-frame 114 is not limited thereto. A cover glass 113 may be disposed on the display panel 110. The cover glass 113 may be disposed on the display panel 110 after a touch sensor (not shown) is disposed on the display panel 110. A second foam pad 111b may be disposed on a surface of the mid-frame 114 which is in contact with the cover glass 113. However, the present disclosure is not limited thereto.

The light emitted from the display panel 110 may be radiated toward the cover glass 113. A surface of the display panel 110 which is in contact with the cover glass 113 may be referred to as a front surface and a surface in contact with the first foam pad 111a may be referred to as a back surface. The back surface of the display panel 110 on which the sensor package module 150 is disposed may be the second area area2 illustrated in FIG. 3. In order to allow the sensor package module 150 to be disposed on the back surface of the display panel 110, a portion of the first foam pad 111a and the heat sink 112 may be removed.

The sensor package module 150 may be disposed in the portion, from which portions of the first foam pad 111a and the heat sink 112 are removed, such that the sensor package module 150 is in contact with the back surface of the display panel 110. Accordingly, the sensor package module 150 can receive the light that has passed through the display panel 110 or irradiate the light toward the cover glass 113. The display panel 110 may be disposed at a position corresponding to the active area AA in FIG. 3.

Figure 5:
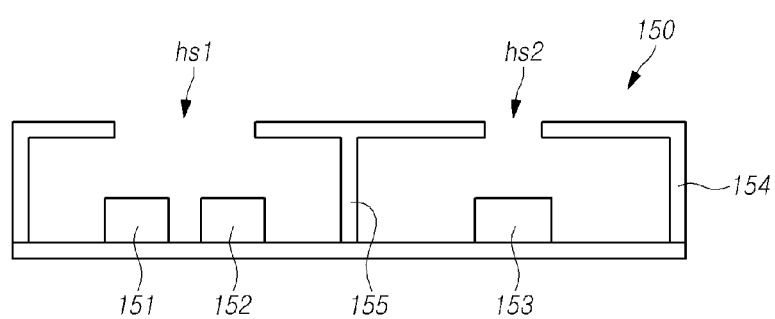
FIG. 5 is a cross-sectional view illustrating a sensor package module employed in the electronic device illustrated in FIG. 4.

FIG. 5 is a cross-sectional view illustrating a sensor package module employed in the electronic device illustrated in FIG. 4.

Referring to FIG. 5, the sensor package module 150 may include a housing 155, light receiving sensors 151 and 152, and a light-emitting device 153. The light receiving sensors 151 and 152 may be a proximity sensor. However, the present disclosure is not limited thereto. Further, the light-emitting device 153 may be a device that emits IR radiation. However, the present disclosure is not limited thereto. The housing 155 may accommodate the light receiving sensors 151 and 152 and the light-emitting device 153 therein. The housing 155 may have a first hole hs1 and a second hole hs2 corresponding to and located above the light receiving sensors 151 and 152 and the light-emitting device 153, which are accommodated in the housing 155. In addition, the housing 155 may has a partition wall 155 disposed between the light receiving sensors 151 and 152 and the light-emitting device 153.

The partition wall 155 may prevent the light emitted from the light-emitting device 153 from directly striking the light receiving sensors 151 and 152 without passing through the first hole hs1 and the second hole hs2. Each of the first hole hs1 and the second hole hs2 provided in the housing 154 may be a circular hole with a diameter of 1 mm. However, the size and shape of the first hole hs1 and the second hole hs2 are not limited thereto. The light receiving sensors 151 and 152 and the light-emitting device 153 may be provided on a substrate, and the lower portion of the housing 155 may be provided with the substrate on which lines for supplying signals and voltages to the light receiving sensors 151 and 152 and the light-emitting device 153 are provided. However, the present disclosure is not limited thereto.

The light receiving sensors 151 and 152 are categorized as a first light receiving sensor 151 and a second light receiving sensor 152. The first light receiving sensor 151 receives visible light from natural light and the second light receiving sensor 152 receives IR radiation. The IR radiation received by the second light receiving sensor 152 may be IR radiation emitted from the light-emitting device 153. However, the light received by the light receiving sensors 151 and 152 and emitted from the light-emitting device 153 is not limited thereto.

Figure 6:
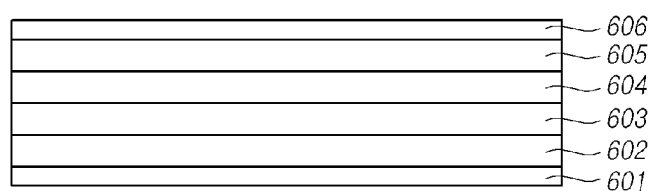
FIG. 6 is a cross-sectional view illustrating the display panel illustrated in FIG. 1.

FIG. 6 is a cross-sectional view illustrating the display panel illustrated in FIG. 1.

Referring to FIG. 6, the display panel 110 may include a substrate 601, a device layer 602 on which the first and second transistors M1 and M2 and the capacitor Cst illustrated in FIG. 2 are fabricated, an organic light-emitting layer 603 emitting light by receiving a current from the device layer 602, a cathode layer 604, and an insulating layer 605. Further, the display panel may further include a polarizing film 606. The substrate 601, the cathode layer 604, and the polarizing film 606 may be formed over the entire area of the display panel 110. Since the cathode layer 604 is made of low work function metals, such as calcium (Ca), aluminum (Al)/lithium (Li), magnesium (Mg)/silver (Ag), or the like, the transmittance thereof is low.

Figure 7:
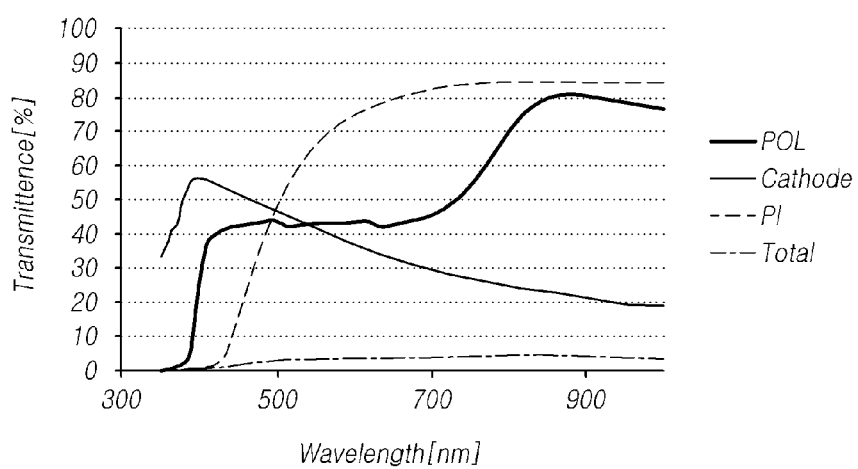
FIG. 7 is a graph illustrating the transmittance of the display panel.

FIG. 7 is a graph illustrating the transmittance of the substrate 601, the cathode layer 604, and the polarizing film 606. Referring to FIG. 7, it can be appreciated that the transmittance of the cathode layer 604 is the lowest. In addition, it can also be appreciated that the cathode layer 604 exhibits a transmittance in the range of 30% to 50% in the visible light range of 525 nm to 560 nm and a transmittance in the range of 20% to 25% in the infrared range of 850 nm to 950 nm. Therefore, it can be understood that increasing the transmittance of the cathode layer 604 is the most effective method of increasing the transmittance of the display panel 110.

As the thickness of the cathode layer 604 is thinner, the transmittance increases. That is, if the thickness of the cathode layer 604 is reduced such that the transmittance of the display panel 110 is 10% or more in a visible light wavelength band and the transmittance in an infrared wavelength band is 30% or more, the sensor package module 150 can be disposed to overlap the active area AA as illustrated in FIG. 3. Here, the cathode layer 604 is a layer in which the cathode 104 illustrated in FIG. 3 is formed.

Figure 8:
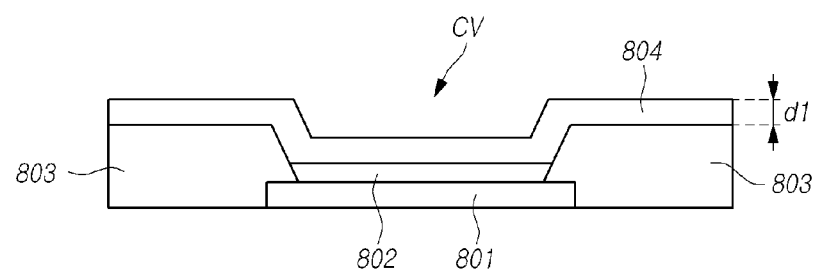
FIG. 8 is a cross-sectional view illustrating a first area of the active area of the electronic device illustrated in FIG. 3.
Figure 9:
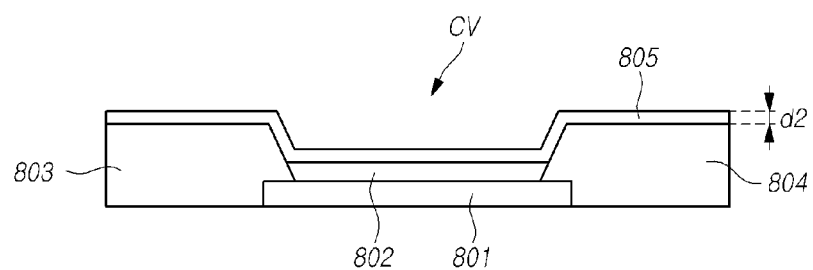
FIG. 9 is a cross-sectional view illustrating a second area of the active area of the electronic device illustrated in FIG. 3.

FIG. 8 is a cross-sectional view illustrating a first area of the active area of the electronic device illustrated in FIG. 3, and FIG. 9 is a cross-sectional view illustrating a second area of the active area of the electronic device illustrated in FIG. 3.

Referring to FIGS. 8 and 9, a pixel defining layer 803 may be provided on an anode 801. The anode 801 may correspond to the anode of the organic light-emitting diode (OLED) illustrated in FIG. 2. A device layer (not shown) may be provided under the anode 801 and may be supplied with a driving current from the source/drain electrodes provided on the device layer. A cavity CV may be formed in the pixel defining layer 803. The organic light-emitting layer 802 may be disposed in the cavity CV. Here, although the organic light-emitting layer 802 is illustrated as being a single layer, the present disclosure is not limited thereto. Further, the organic light-emitting layer 802 may emit red, green, and blue light depending on the material. The color of light emitted from the organic light-emitting layer 802 is not limited thereto.

A cathode 804 may be disposed on the organic light-emitting layer 802. The cathode 804 may be the cathode of the organic light-emitting diode (OLED) illustrated in FIG. 2. The cathode 804 may be an electrode that is disposed in the active area AA as illustrated in FIG. 3 to be common to all of the subpixels. In this case, the thickness of the cathode 804 in the first area may have a first thickness d1 as illustrated in FIG. 8. Further, the thickness of the cathode 804 may have a second thickness d2 as illustrated in FIG. 9. The second thickness d2 may be thinner than the first thickness d1.

When the thickness of the cathode 804 is reduced, the transmittance of the cathode 804 may be increased, but the surface resistance of the cathode 804 may be increased to increase power consumption. Thus, the cathode 804 may have a first thickness d1 in the first area area1 and a second thickness d2 in the second area area2 in the active area AA as illustrated in FIG. 3. In addition, compensation driving may be performed on the subpixels P disposed in a location corresponding to the second area area2, in which the thickness of the cathode 804 is thin, to prevent the brightness from being lowered. The compensation driving may be performed by varying the voltage level of the data voltage transferred to the subpixel P disposed in the second area area2. The second area area2 may be an area corresponding to at least one of the first hole hs1 or the second hole hs2 of the sensor package module illustrated in FIG. 5 in the active area AA.

Figure 10:
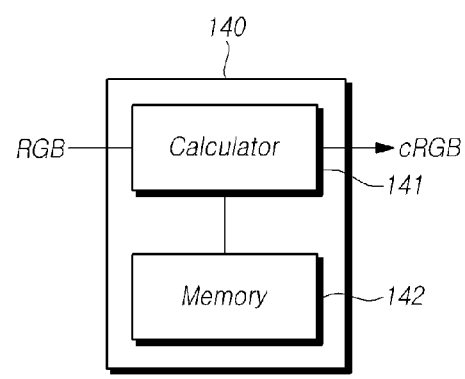
FIG. 10 is a block diagram illustrating an exemplary aspect of the timing controller illustrated in FIG. 1.

FIG. 10 is a block diagram illustrating an exemplary aspect of the timing controller illustrated in FIG. 1.

Referring to FIG. 10, the timing controller 140 may include a memory 142 storing compensation algorithm and information regarding the position of the second area area2 of the display panel 110 and a calculator 141 calculating information regarding the compensated image signal corresponding to the information and the compensation algorithm about the position of the second area area2.

The memory 142 may include a lookup table in which the addresses corresponding to the positions of the subpixels in the active area AA and the positions of the first area area1 and the second area area2 corresponding to the addresses may be stored. The memory 142 may store a compensation algorithm for calculating information regarding an image signal to be compensated for depending on the gradation and the color information.

The calculator 141 may receive the image signal RGB, calculate the position information and the compensation algorithm for the second area area2, and output a compensated image signal cRGB. The compensated image signal cRGB may be transferred to the data driver 120. The compensated image signal cRGB compensated in the calculator 141 is not compensated only by the information regarding the second area area2.

Figure 11:
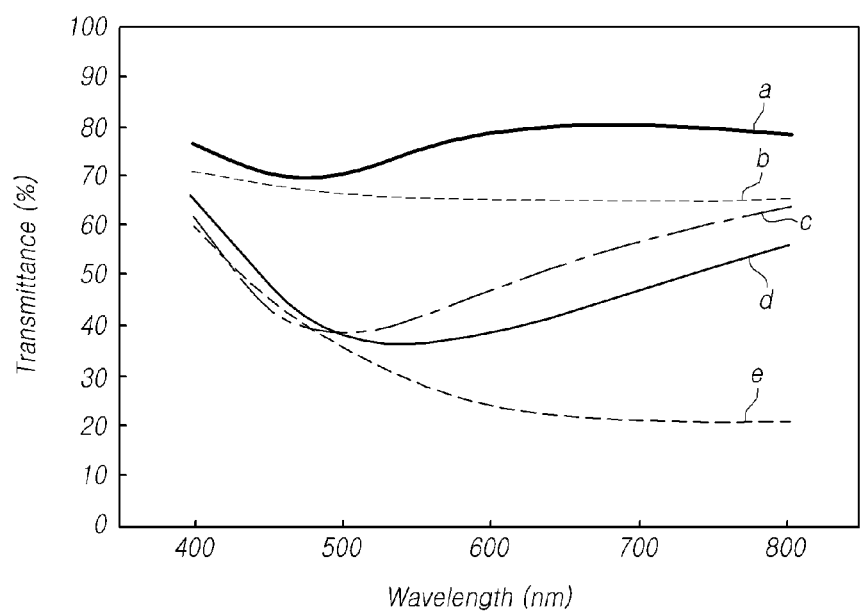
FIG. 11 is a graph illustrating the transmittance of a cathode according to metals.

FIG. 11 is a graph illustrating the transmittance of a cathode according to the metal material.

Referring to FIG. 11, the cathode 104 illustrated in FIG. 3 may be formed of various metals. a represents a case in which the cathode 104 is a double layer of calcium (Ca)/silver (Ag), b represents a case in which the cathode 104 is a double layer of barium (Ba)/silver (Ag), c represents a case in which the cathode 104 is a double layer of magnesium (Mg)/silver (Ag), and d and e represent cases in which the cathode 104 is a single layer of silver (Ag). The thicknesses of calcium (Ca) and silver (Ag) in the case a are respectively 10 nm, the thicknesses of barium (Ba) and silver (Ag) in the case b are respectively 10 nm, and the thicknesses of magnesium (Mg) and silver (Ag) in the case a are respectively 10 nm. In addition, the case d represents that the thickness of silver (Ag) is 10 nm and the case e represents that the thickness of silver (Ag) is 20 nm.

It can be appreciated that, in the case in which the cathode 104 is the double layer of calcium (Ca)/silver (Ag) or the double layer of barium (Ba)/silver (Ag), the transmittance is higher than in the case in which the cathode 104 is the double layer of magnesium (Mg)/silver (Ag) or the single layer of silver (Ag).

Therefore, in a case the cathode 104 is a double layer of calcium (Ca)/silver (Ag) or a double layer of barium (Ba)/silver (Ag), the transmittance of the display panel 110 is high even when the thickness of the cathode 104, positioned to correspond to the holes hs1 and hs2 of the sensor package module 150 illustrated in FIG. 5, is not as reduced as illustrated in FIG. 9. Thus, the light receiving sensors 151 and 152 may easily receive IR radiation or visible light, and IR radiation emitted from the light-emitting device 153 may easily pass through the display panel 110. Accordingly, the cathode 104 of the electronic device 300 may have a constant thickness in the active area AA regardless of the position of the sensor package module 150. Here, the constant thickness means that there may be a thickness difference within an error range that may occur in the process.

Figure 12:
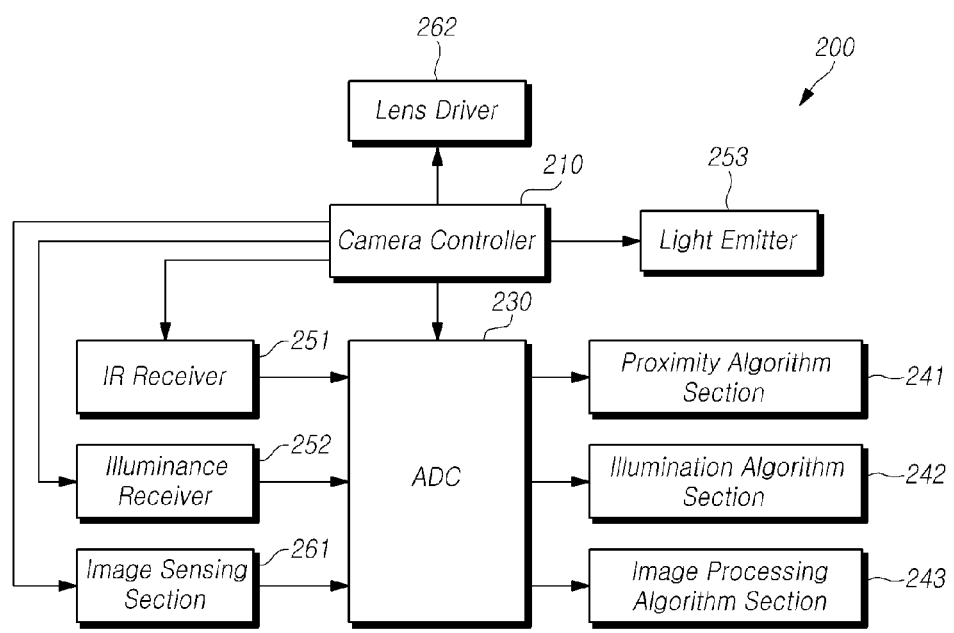
FIG. 12 is a view illustrating a structure of a sensor package module according to an exemplary aspect.

FIG. 12 is a view illustrating a structure of the sensor package module according to an exemplary aspect.

Referring to FIG. 12, the sensor package module 200 includes a camera module having an image sensing section 261, a lens driver 262, and a camera controller 210 for controlling the image sensing section 261 and the lens driver 262, and a proximity sensor having light receivers 251 and 252 for detecting light and a light emitter 253 for emitting light. The light receivers 251 and 252 and the light emitter 253 may be controlled by the camera controller 210.

The image sensing section 261 may drive an image sensor. The image sensing section 261 may supply at least one of power or a signal to the image sensor to control the image sensor to generate an analog image signal. The image sensing section 261 may be at least one of a device for driving the image sensor or a program for driving the device. In addition, the image sensing section 261 may include the image sensor.

The lens driver 262 drives a lens. The lens driver 262 receives the distance information regarding a subject and may control the focus of the lens according to the image sensor. In addition, the lens driver may control the aperture depending on the intensity of external light. The lens driver 262 may be at least one of a device for driving the lens or a program for driving the device.

The camera controller 210 may control the image sensing section 261 and the lens driver 262 by transmitting control signals to the image sensing section 261 and the lens driver 262. The camera controller 210 may be a calculating or computing device operated by a specific program.

The light receivers 251 and 252 may drive light receiving sensors. The light receivers 251 and 252 may include an IR radiation receiver 251 for driving an IR radiation receiving sensor to receive IR radiation and an illuminance receiver 252 for driving an illuminance sensor to receive visible light. The IR radiation receiver 251 and the illuminance receiver 252 operate in response to the control signal received from the camera controller 210. The IR radiation receiver 251 and the illuminance receiver 252 generate an analog sensing signal, respectively. The light receivers 251 and 252 may be at least one of a device for driving the IR radiation receiving sensor and the illuminance sensor or a program for driving the element. The light receivers 251 and 252 may include an IR radiation receiving sensor and an illuminance sensor.

The light emitter 253 may drive the light-emitting device. The light emitter 253 may be at least one of a device for driving the light-emitting device or a program for driving the device. The light emitter 253 may be controlled by the camera controller 210.

The sensor package module 200 may include an ADC 230 that converts an analog image signal output from the image sensor into a digital image signal and converts an analog sensing signal received from the light receiver into a digital sensing signal. That is, the single ADC 230 may convert the analog image signal and the analog sensing signal into the digital image signal and the digital sensing signal. The camera controller 210 may control the camera module and the proximity sensor to be driven in a time-division manner. Accordingly, the camera module and the proximity sensor are not driven at the same time, so that the analog image signal is converted into the digital image signal and the analog sensing signal received from the light receivers 251 and 252 is converted into the digital sensing signal by the single ADC 230. The camera controller 210 may control the lens driver 262 by controlling the focus and aperture of the lens using information regarding the illuminance received from the light receiver and distance information.

The sensor package module 200 may include a proximity algorithm section 241, an illuminance algorithm section 242, and an image processing algorithm section 243. The proximity algorithm section 241 may detect the proximity and position using information detected by the IR radiation receiver 252. The illuminance algorithm section 242 may determine the intensity of external light using the information detected by the illumination light receiver 252. The image processing algorithm section 243 may generate information regarding the image using the information detected by the image sensing section 261.

Figure 13:
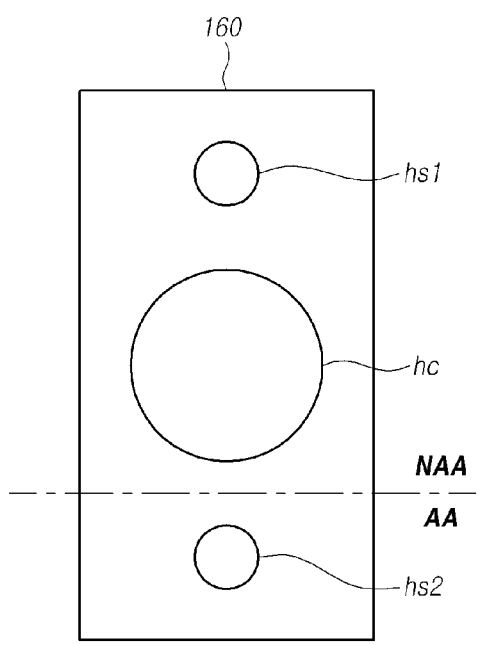
FIG. 13 is a plan view illustrating a first aspect of the sensor package module employing the sensor package illustrated in FIG. 11.
Figure 14:
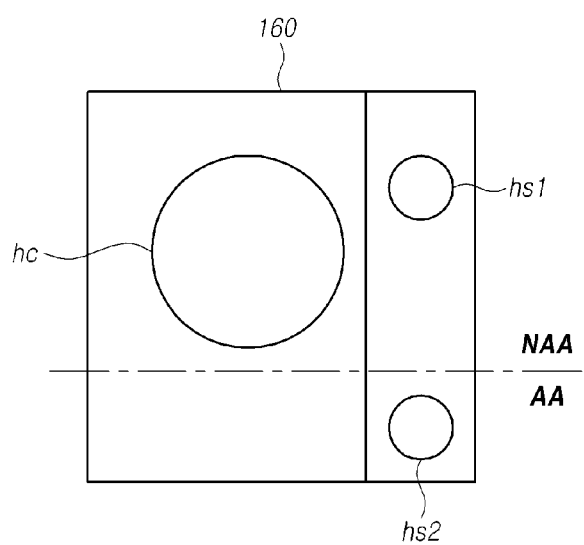
FIG. 14 is a plan view illustrating a second aspect of the sensor package module employing the sensor illustrated in FIG. 11.
Figure 15:
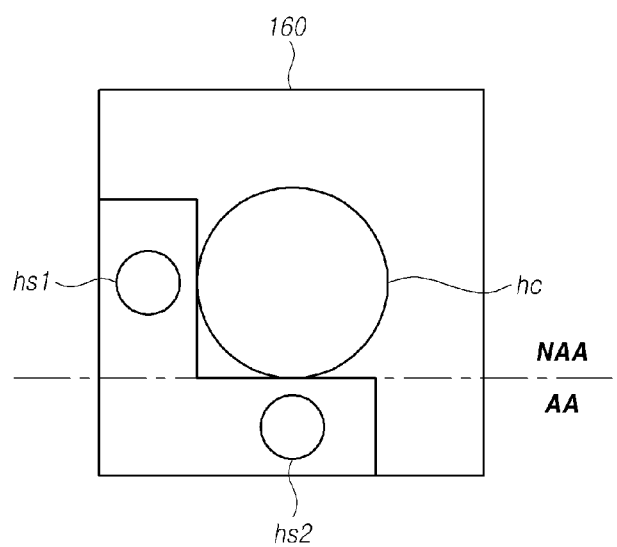
FIG. 15 is a plan view illustrating a third aspect of the sensor package module employing the sensor illustrated in FIG. 11.
Figure 16:
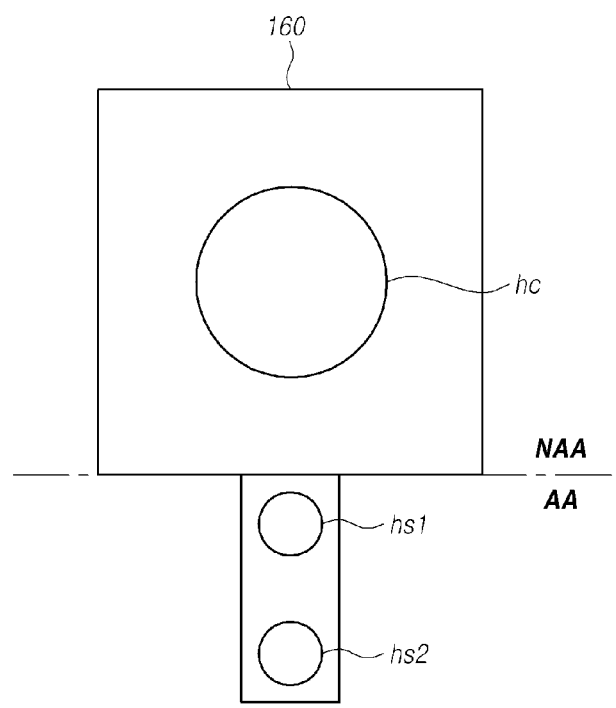
FIG. 16 is a plan view illustrating a fourth aspect of the sensor package module employing the sensor illustrated in FIG. 11.
Figure 17:
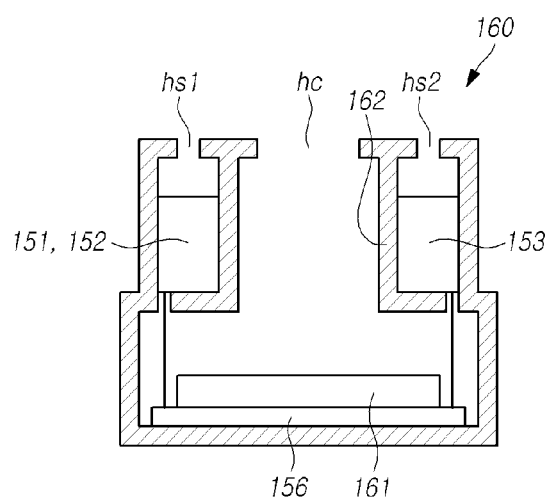
FIG. 17 is a cross-sectional view illustrating an exemplary aspect of the sensor package module illustrated in FIG. 11.

FIG. 13 is a plan view illustrating a first aspect of the sensor package module employing the sensor package illustrated in FIG. 11, FIG. 14 is a plan view illustrating a second aspect of the sensor package module employing the sensor illustrated in FIG. 11, FIG. 15 is a plan view illustrating a third aspect of the sensor package module employing the sensor illustrated in FIG. 11, FIG. 16 is a plan view illustrating a fourth aspect of the sensor package module employing the sensor illustrated in FIG. 11, and FIG. 17 is a cross-sectional view illustrating an exemplary aspect of the sensor package module illustrated in FIG. 11.

The sensor package module 160 may include light receiving sensors 151 and 152 for receiving at least one of IR radiation or visible light and a light-emitting device 153 for emitting IR radiation. In addition, the sensor package module 160 may include an image sensor 156 that generates an image using light passing through a lens (not shown). The sensor package module 160 may be a device including the light receiving sensors 151 and 152, the light-emitting device 153, and the image sensor 156, and may include a device for controlling the sensor package module and a program for controlling the device.

The image sensor 1456 may be disposed on the substrate 154 and the light receiving sensors 151 and 152 and the light-emitting device 153 may also be connected to the substrate 154 through lines respectively. However, the present disclosure is not limited thereto. The sensor package module 160 may be provided with a lens holder 162 at a position corresponding to the image sensor 156. The lens holder 162 supports a plurality of lenses and may be operated by a lens driver. In the sensor package module 160, the light receiving sensors 151 and 152 and the light-emitting device 153 may be disposed in the upper and lower portions of the lens holder 162 as illustrated in FIG. 13. Therefore, the sensor package module 160 has the first hole hs1 and the second hole hs2 corresponding to the light receiving sensors 151 and 152 and the light-emitting device 153, and a third hole hc serving as the lens holder 162 in which the lens is disposed. The first and second holes may be disposed above and below the third hole hc. In this case, the lens holder 162 has a predetermined height and can serve as the partition wall 155 illustrated in FIG. 5. The first hole hs2 and the third hole hc may be disposed in the bezel area NAA illustrated in FIG. 3, and the second hole hs2 may be disposed in the active area AA illustrated in FIG. 3.

The light receiving sensors 151 and 152 and the light-emitting device 153 may be disposed in the right portion of the sensor package module 160 as illustrated in FIG. 14. In this case, the first hole hs1 and the third hole hc may be disposed in the bezel area NAA illustrated in FIG. 3, and the second hole hs2 may be disposed in the active area AA illustrated in FIG. 3.

In addition, the light receiving sensors 151 and 152 and the light-emitting device 153 may be disposed in the lower left portion of the sensor package module 160, arranged in the shape of an "L," as illustrated in FIG. 15. In this case, the first hole hs1 and the third hole hc may be disposed in the bezel area NAA illustrated in FIG. 3, and the second hole hs2 may be disposed in the active area AA illustrated in FIG. 3. However, the present disclosure is not limited thereto, and the first hole hs1 and the second hole hs2 may be disposed in the active area AA corresponding to the shape of the bezel area NAA.

In addition, the light receiving sensors 151 and 152 and the light-emitting device 153 may be disposed in the bottom of the sensor package module 160, arranged in the shape of in an "I," as illustrated in FIG. 16. In this case, the third hole hc may be disposed in the bezel area NAA illustrated in FIG. 3, and the first hole hs1 and the second hole hs2 may be disposed in the active area AA illustrated in FIG. 3.

However, the arrangement of the light receiving sensors 151 and 152 and the light-emitting device 153 is not limited to FIGS. 14 to 16. The first hole hs1 and the third hole hc or the third hole hc may be disposed at the position corresponding to the first hole h1 disposed in the bezel area NAA illustrated in FIG. 3.

The foregoing descriptions and the accompanying drawings have been presented in order to explain certain principles of the present disclosure by way of example. A person having ordinary skill in the art to which the present disclosure relates could make various modifications and variations by combining, dividing, substituting for, or changing the elements without departing from the principle of the present disclosure. The foregoing aspects disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

What is claimed is:

1. An organic light-emitting display device comprising:
   a display panel comprising an active area in which a plurality of subpixels are arrayed, and a bezel area in which lines, through which a signal and a voltage to be supplied to the subpixels are transferred, are disposed, wherein each subpixels has a cathode and an anode;
   a data driver supplying a data signal to the subpixels;
   a gate driver supplying a gate signal to the subpixels;
   a timing controller controlling the data driver and the gate driver; and
   a sensor package module having a portion that overlaps the active area,
   wherein the active area has a first area that does not overlapping with the sensor package module and a second area that overlaps with the sensor package module, and a thickness of the cathode in the second area is thinner than a thickness of the cathode in the first area.

2. The organic light-emitting display device according to claim 1, wherein the display panel has a transmittance of 10% or more in a visible light wavelength band a transmittance of 30% or more in an infrared wavelength band in the active area with respect to the cathode in the subpixels.

3. The organic light-emitting display device according to claim 1, wherein the sensor package module has two holes, and the second area is disposed at a position corresponding to the two holes.

4. The organic light-emitting display device according to claim 1, wherein the subpixel has a light-emitting layer disposed between the cathode and the anode.

5. The organic light-emitting display device according to claim 1, wherein the sensor package module is disposed on a rear surface of the display panel.

6. The organic light-emitting display device according to claim 1, wherein the sensor package module includes,
   a camera module including an image sensing section that drives an image sensor, a lens driver that drives a lens to project light to the image sensor and a camera controller that controls the image sensing section and the lens driver, and a proximity sensor including a light receiver that drives a light receiving sensor to detect light and a light emitter that drives a light-emitting device to emit light, wherein the camera controller controls the light receiver and the light emitter.

7. The organic light-emitting display device according to claim 6, wherein the sensor package module includes a housing accommodating the image sensor, the light receiving sensor, and the light-emitting device, and wherein the housing includes a lens holder that supports the lens and is disposed between the light receiving sensor and the light-emitting device.

8. The organic light-emitting display device according to claim 7, wherein the hole corresponding to the lens holder is disposed to overlap the bezel area, and at least one of the light receiving sensor or the light-emitting device is disposed to overlap the active area.

9. The organic light-emitting display device according to claim 6, further comprising an analog-digital converter converting an analog image signal into a digital image signal and converting an analog sensing signal to a digital sensing signal, wherein the analog image signal is output from the image sensor and the analog sensing signal is processed in the light receiver.

10. The organic light-emitting display device according to claim 9, wherein the camera controller controls the camera module and the proximity sensor to be driven in a time-division manner.

11. The organic light-emitting display device according to claim 1, wherein the sensor package module includes a light-emitting device emitting light, a light receiving sensor receiving light, and a housing accommodating the light-emitting device and the light receiving sensor, and wherein the housing has a first hole allowing the light from the light-emitting device to exit therethrough and a second hole allowing the light to enter the light receiving sensor, and the second area is disposed at a position corresponding to the first hole and the second hole.

12. The organic light-emitting display device according to claim 1, wherein the timing controller includes, a memory storing information regarding a position of the second area of the display panel, and a calculator calculating information regarding a compensated image signal corresponding to information regarding a position of the second area.

13. An organic light-emitting display device comprising:

a display panel comprising an active area in which a plurality of subpixels are arrayed, and a bezel area in which lines, through which a signal and a voltage to be supplied to the subpixels are transferred, are disposed, wherein each subpixels has a cathode and an anode;

a data driver supplying a data signal to the subpixels;

a gate driver supplying a gate signal to the subpixels;

a timing controller controlling the data driver and the gate driver;

a sensor package module having a portion that overlaps the active area; and a support member disposed on a lower portion of a rear surface of the display panel, and a foam pad disposed between the display panel and the support member, wherein the sensor package module is disposed on a portion of the rear surface of the display panel where a portion of the foam pad is removed.

14. A sensor package module comprising:

a camera module including an image sensing section that drives an image sensor, a lens driver that drives a lens to project light to the image sensor, and a camera controller that controls the image sensing section and the lens driver; and a proximity sensor including a light receiver that drives a light receiving sensor to sense light and a light emitter that drives a light-emitting device to emit light, wherein the camera controller controls the light receiver and the light emitter, and wherein the camera controller controls the camera module and the proximity sensor to be driven in a time-division manner.

15. The sensor package module according to claim 14, further comprising an analog-digital converter converting an analog image signal into a digital image signal and converting an analog sensing signal to a digital sensing signal, wherein the analog image signal is output from the image sensor and the analog sensing signal is processed in the light receiver.

16. The sensor package module according to claim 14, wherein the light receiving sensor includes a first light receiving sensor sensing infrared radiation and a second light receiving sensor receiving visible light, and wherein the light-emitting device emits infrared radiation.

17. The sensor package module according to claim 14, further comprising a housing accommodating the image sensor, the light receiving sensor, and the light-emitting device, wherein the housing includes a lens holder disposed above the image sensor and between the light-emitting device and the light receiving sensor within the housing, and wherein three holes respectively corresponding to the lens holder, the light-emitting device and the light receiving sensor are provided in an upper portion of the housing.

18. The sensor package module according to claim 17, wherein the lens holder is disposed between the holes among the three holes that correspond to the light-emitting device and the light receiving sensor.

* * * * *